(12) United States Patent
Kim

(10) Patent No.: US 10,049,999 B2
(45) Date of Patent: Aug. 14, 2018

(54) ELECTRONIC DEVICE

(71) Applicant: Samsung Electronics Co., Ltd., Gyeonggi-do (KR)

(72) Inventor: Seijin Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 201 days.

(21) Appl. No.: 14/514,955

(22) Filed: Oct. 15, 2014

(65) Prior Publication Data

US 2015/0108657 A1 Apr. 23, 2015

(30) Foreign Application Priority Data

Oct. 18, 2013 (KR) .................. 10-2013-0124935

(51) Int. Cl.
*H01L 23/48* (2006.01)
*H01L 23/00* (2006.01)
*H01L 23/14* (2006.01)
*H01L 23/538* (2006.01)
*H01L 25/065* (2006.01)
*H01L 23/498* (2006.01)

(52) U.S. Cl.
CPC .......... *H01L 24/16* (2013.01); *H01L 23/147* (2013.01); *H01L 23/5384* (2013.01); *H01L 23/5385* (2013.01); *H01L 25/065* (2013.01); *H01L 23/49816* (2013.01); *H01L 2224/131* (2013.01); *H01L 2224/16146* (2013.01); *H01L 2224/16227* (2013.01); *H01L 2224/16235* (2013.01); *H01L 2224/81815* (2013.01); *H01L 2924/15192* (2013.01); *H01L 2924/15311* (2013.01); *H01L 2924/37001* (2013.01)

(58) Field of Classification Search
CPC ..... H01L 2224/131; H01L 2224/16146; H01L 2224/81815; H01L 2224/16235; H01L 2224/16227; H01L 23/5384; H01L 23/065; H01L 23/5385; H01L 23/147; H01L 24/16
See application file for complete search history.

(56) References Cited

U.S. PATENT DOCUMENTS 9,099,999 B1 * 8/2015 Wang .................... H03K 17/00
2013/0082399 A1 4/2013 Kim et al.

FOREIGN PATENT DOCUMENTS

KR 10-2011-0033367 A 3/2011
KR 10-1060117 A 8/2011

* cited by examiner

*Primary Examiner* — Hoa B Trinh
(74) *Attorney, Agent, or Firm* — Cha & Reiter, LLC.

(57) ABSTRACT

A semiconductor device and electronic device comprising the same includes at least one dummy chip having at least one Through Silicon Via (TSV), and at least one active chip connected to the at least one dummy chip. The at least one active chip exchanges an electrical signal through the at least one TSV. The at least one active chip may be a memory chip and a non-memory chip in a vertically stacked (3D) configuration, connected through an electrical path that includes the TSV of the dummy chip. Embodiments may include multiple memory chips and dummy chips.

20 Claims, 4 Drawing Sheets

ELECTRONIC DEVICE

CLAIM OF PRIORITY

This application claims the benefit under 35 U.S.C. § 119(a) of a Korean patent application filed on Oct. 18, 2013 in the Korean Intellectual Property Office and assigned Serial No. 10-2013-0124935, the entire disclosure of which is hereby incorporated by reference.

BACKGROUND

Field

The present disclosure relates to an electronic device, and more particularly, to a semiconductor device including a plurality of chips and an electronic device including the semiconductor device.

Description of the Related Art

Recent technological advances have continued to increase capacity and speed of semiconductor chips and Integrated Circuits (IC) used in most electronic devices. As large capacity semiconductor chips and ICs have been mounted within small spaces, various attempts for efficiently driving them have been proposed.

In order to enhance an integration level of semiconductor devices, so-called three-dimensional (3D) integration/packaging technology (hereafter, "3D technology") in which a plurality of semiconductor chips are stacked, has been applied, which improves space utilization efficiency as compared to traditional two-dimensional (2D) methods. A structure that enhances an integration level by reducing a semiconductor chip size using a 3D integration structure of a semiconductor chip is desired.

For realizing such 3D technology, a Through Silicon Via (TSV) method is commonly used. The TSV method improves performance over prior interconnect methods by reducing degradation in terms of data bandwidth and transmission speed deterioration (previously a function of package variation). In the TSV method, by generating a path that penetrates a plurality of semiconductor chips or wafers and by forming an electrode in the path, an electrical connection between semiconductor chips (or layers in a single integrated circuit) is formed. Stacked semiconductor devices that apply a TSV method are directly connected to via without a wire, a package "sub", or a package ball used in a System-in-Package (SiP) method and a package-on-package (PoP) method. (In the latter packaging methods, a bump or ball is formed between paths that penetrate a plurality of semiconductor chips to electrically connect the chips.)

In a TSV method, because stacked semiconductor chips are directly penetrated, when separate space for penetration is designed, a semiconductor chip design region allocated for active circuits decreases. Moreover, when penetrating the semiconductor chip, the semiconductor chip may be damaged, resulting in increased process cost.

SUMMARY

Disclosed herein is an electronic device including a semiconductor device electrically connected using a dummy chip including a TSV.

In accordance with an aspect of the present invention, an electronic device includes a semiconductor device including: at least one dummy chip having at least one TSV; and at least one active chip connected to the at least one dummy chip. The at least one active chip exchanges an electrical signal through the TSV of the at least one dummy chip. The at least one active chip may be a memory chip and a non-memory chip in a vertically stacked (3D) configuration, connected through an electrical path that includes the TSV of the dummy chip.

BRIEF DESCRIPTION OF THE DRAWINGS

Aspects, features and advantages of the present invention will be more apparent from the following detailed description in conjunction with the accompanying drawings, in which.

DETAILED DESCRIPTION

Figure 1A:
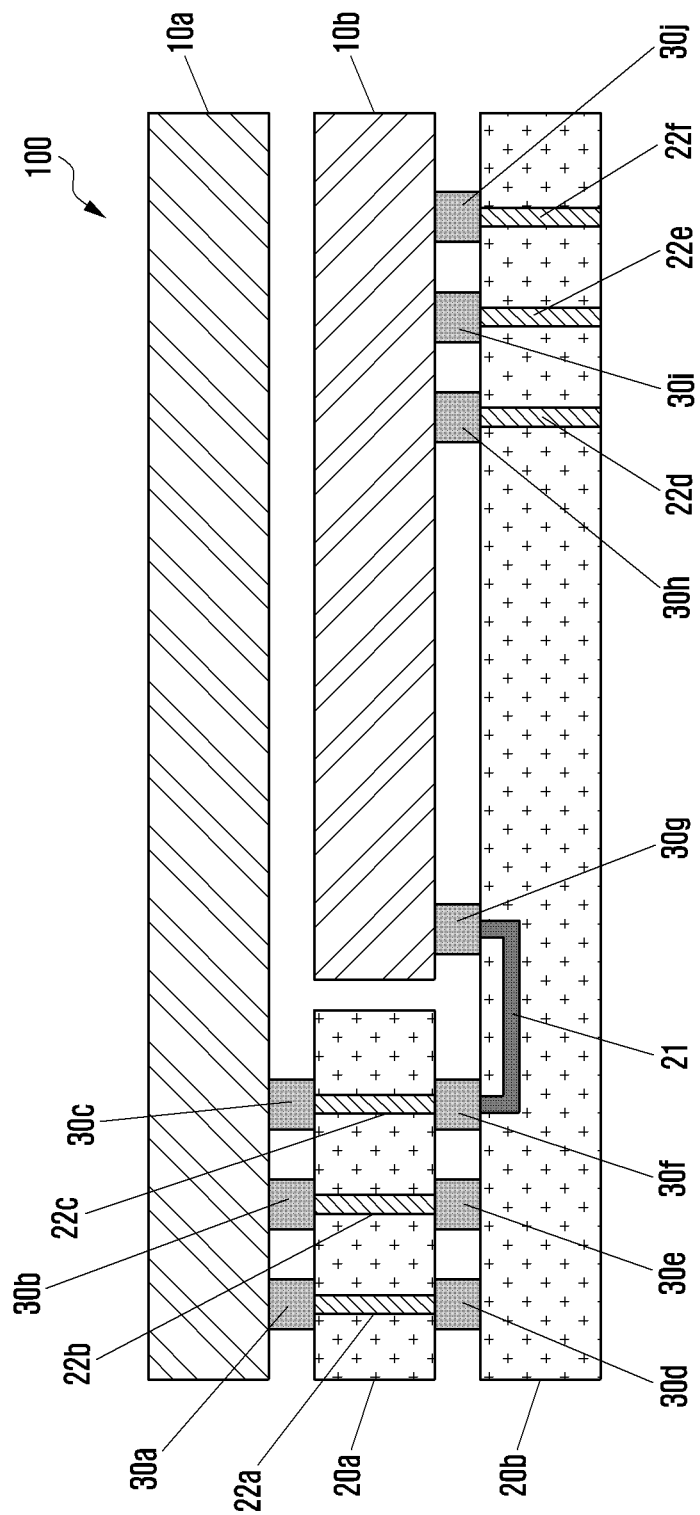
FIG. 1A and FIG. 1B are cross-sectional views illustrating a semiconductor device according to an example, with FIG. 1A being a partial cross sectional view showing the device without a substrate and FIG. 1B showing the device with a substrate.

Hereinafter, exemplary embodiments of the present invention are described in detail with reference to the accompanying drawings. The same or like reference numbers are used throughout the drawings to refer to the same or like parts. The views in the drawings may be schematic views only, and may not be to scale or correctly proportioned. Detailed descriptions of well-known functions and structures incorporated herein may be omitted to avoid obscuring the subject matter of the present invention.

Figure 1B:
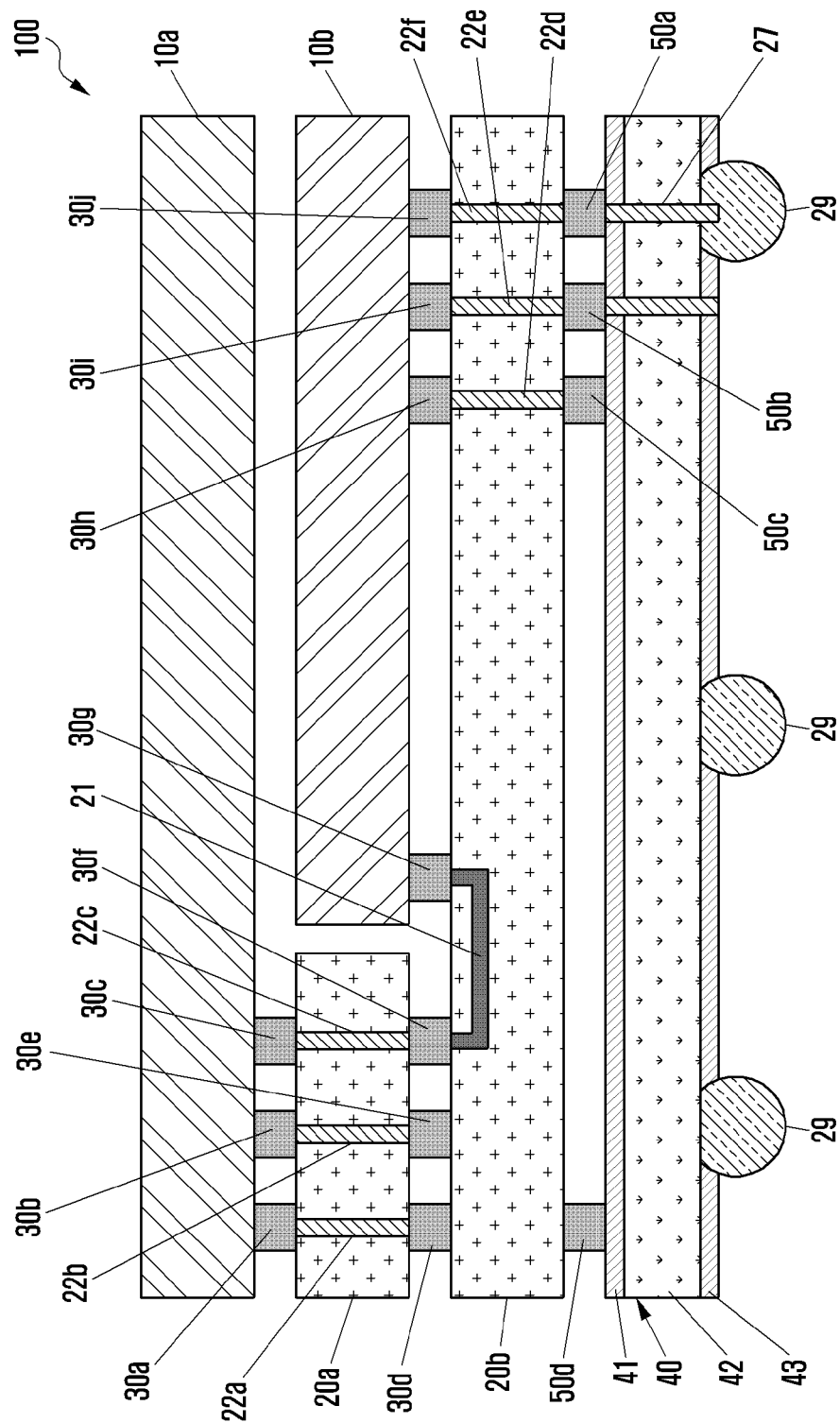

FIGS. 1A and 1B are cross-sectional views illustrating a semiconductor device, 10, according to an example. For clarity of illustration, FIG. 1A shows the device without a substrate whereas FIG. 1B shows the device with a substrate. Semiconductor device 100 can also be considered an electronic device.

As shown in FIGS. 1A and 1B, semiconductor device 10 includes a plurality of semiconductor chips 10a, 10b, 20a, and 20b that exchange an electrical signal amongst one another. Chips 10a, 10b, 20a, and 20b may exchange an electrical signal with one another over a partial region, as illustrated. (Vertical inter-layer connections are provided in the left and right hand regions, while the central region is devoid of interlayer electrical connections in the example.) The chips 10a, 10b, 20a, 20b are arranged in a vertical ("Z" direction) stack, so as to form a 3D package or 3D integrated circuit (IC). The lowest chip 20b in the stack may be disposed on and connected to a substrate 40 using at least one flip chip metallized pad 50a, 50b, 50c, and 50d. Substrate 40 may also be referred to as a board or printed circuit board (PCB).

The semiconductor device 10 may include at least one controller (not shown) formed within one or more of the chips, e.g. within chip 10b Some of chips 10a, 10b, 20a, and 20b may individually connect to the controller, which in turn may be connected to an external device. The controller may comprise an interface that connects the external device and the semiconductor device 10, and may control data flow and operation of each of the semiconductor chips 10a, 10b, 20a, and 20b within the semiconductor device.

The plurality of semiconductor chips 10a, 10b, 20a, and 20b may include at least one active chip 10a and 10b and at least one dummy chip 20a and 20b. Each active chip may be an integrated circuit. Each dummy chip may only serve a connection function and may be devoid of active circuitry for other functions.

The at least one active chip 10a and 10b may include a memory chip 10a that performs a memory function and a non-memory chip 10b. The memory chip 10a may be a volatile memory (e.g., Random Access Memory (RAM)) or a non-volatile memory (e.g., Read Only Memory (ROM), FLASH memory). The non-memory chip 10b may comprise a processor or an Application Processor (AP), which may embody the above-noted controller(s).

Dummy chips 20a and 20b are each a semiconductor chip with silicon or other dielectric material 23a, 23b for exchanging an electrical signal between the stacked active chips 10a and 10b. At least one dummy chip 20a and 20b may include at least one Through Silicon Via (TSV). The first dummy chip 20a may include at least one TSV 22a, 22b, and 22c. The second dummy chip 20b may include at least one TSV 22d, 22e, and 22f. The second dummy chip 20b may further include a connection wiring 21 that can exchange an electrical signal between the first dummy chip 20a and the non-memory chip 10b. The active chips 10a and 10b may be each separately connected to a power source.

In the example, dummy chip 20a and active chip 10b are at the same vertical level in the stack, are laterally offset from each other in the horizontal direction, and are each smaller in at least one horizontal dimension than chips 10a, 20b and substrate 40. Chips 10a, 20b and board 40 are illustrated to have approximately the same length and/or width in a horizontal plane. In other embodiments, they may have different geometries in the horizontal plane.

Connection wiring 21 may be embedded within the semiconductor material of chip 20b as illustrated. Wiring 21 has a central portion extending horizontally at a distance below the top surface of chip 20b, and first and second end portions on opposite sides extending vertically downward from the top surface of chip 20b.

The plurality of semiconductor chips 10a, 10b, 20a, and 20b may exchange an electrical signal via at least one conductive bump 30a-30j formed at one surface thereof. (Prior to final fabrication, each conductive bump such as 30a may originally comprise first and second bumps or connection pads attached to the respective chips such as 10a, 20a to be soldered. In a high temperature soldering process, the bumps face each other, melt and fuse to form the single bump 30a, 30b, etc.) In an exemplary embodiment, the memory chip 10a may transfer an electrical signal to the first dummy chip 20a through at least one conductive bump 30a, 30b, and 30c disposed at a bottom surface of memory chip 10a. At least one TSV 22a, 22b, and 22c is connected on a top end thereof to the at least one conductive bump 30a, 30b, and 30c, and at a bottom end thereof to at least one conductive bump 30d, 30e and 30f. As such, the electrical signal from the memory chip 10a is transferred to the second dummy chip 20b through the at least one TSV 22a, 22b and 22c and the at least one conductive bump 30d, 30e, and 30f disposed between the bottom surface of dummy chip 20a and the top surface of dummy chip 20b. The second dummy chip 20b may transfer the electrical signal received from the memory chip 10a to the non-memory chip 10b (and/or may transfer an electrical signal received from the non-memory chip 10b to the first dummy chip 20a to the memory chip 10a) through the connection wiring 21. Wiring 21 connects the at least one conductive bump 30d, 30e, and 30f disposed at the bottom surface of the first dummy chip 20a and the at least one conductive bump 30g, 30h, 30i, and 30j disposed at the bottom surface of the non-memory chip 10b. (In the example of FIG. 1B, only the conductive bumps 30c and 30g are connected by connection wiring 21; however, additional connections may be made through other conductive bumps at the bottom surfaces of the respective chips 20a and 10b in other implementations.) The same or different conductive bumps, TSVs and wiring may be used to transfer signals in the opposite direction from non-memory chip 10b to memory chip 10a through dummy chips 20a and 20b.

In an exemplary embodiment, the second dummy chip 20b may transfer an externally provided electrical signal to the above-noted controller (built into chip 10b but not shown) through at least one TSV 22d, 22e, and 22f within the second dummy chip 20b. The TSVs 22d, 22e and 22f are connected at a top end thereof to conductive bumps 30h, 30i and 30j, respectively, and at a bottom end thereof to flip chip pads 50c, 50b and 50a. The second dummy chip 20b may thus transfer electrical signals to and from the substrate 40 and non-memory chip 10b through at least one flip chip pad 50a, 50b, 50c, and 50d connected to at least one TSV 22d, 22e, and 22f. Substrate 40 includes a dielectric material 41 such as silicon, upper metallization 41, lower metallization 43 and balls 29 which are part of a ball grid array. Balls 29 are used to make individual connections between connection points of an external device and desired connection points of device 10 within at least non-memory chip 10b through TSVs within substrate 40 and within dummy chip 20b. For example, a TSV 27 is formed within substrate 40 and connects the right-most ball 29 to the flip chip pad 50a. Direct connections between balls 29 and memory chip 10a are also possible through TSVs in the dummy chips 20a, 20b. For instance, although not shown, a TSV within substrate 40 may be used to connect flip chip pad 50d to the left-most ball 29, and another TSV within dummy chip 20b may be used to connect flip chip pad 50d to the bump 30d for a direct path connection (through the TSV 22a) between the left-most ball 29 and the memory 10a. Also, the metallization 41 may be patterned to enable connections among flip chip pads 50a-50d, allowing for additional electrical pathways between non-memory chip 10b and memory chip 10a.

Figure 2A:
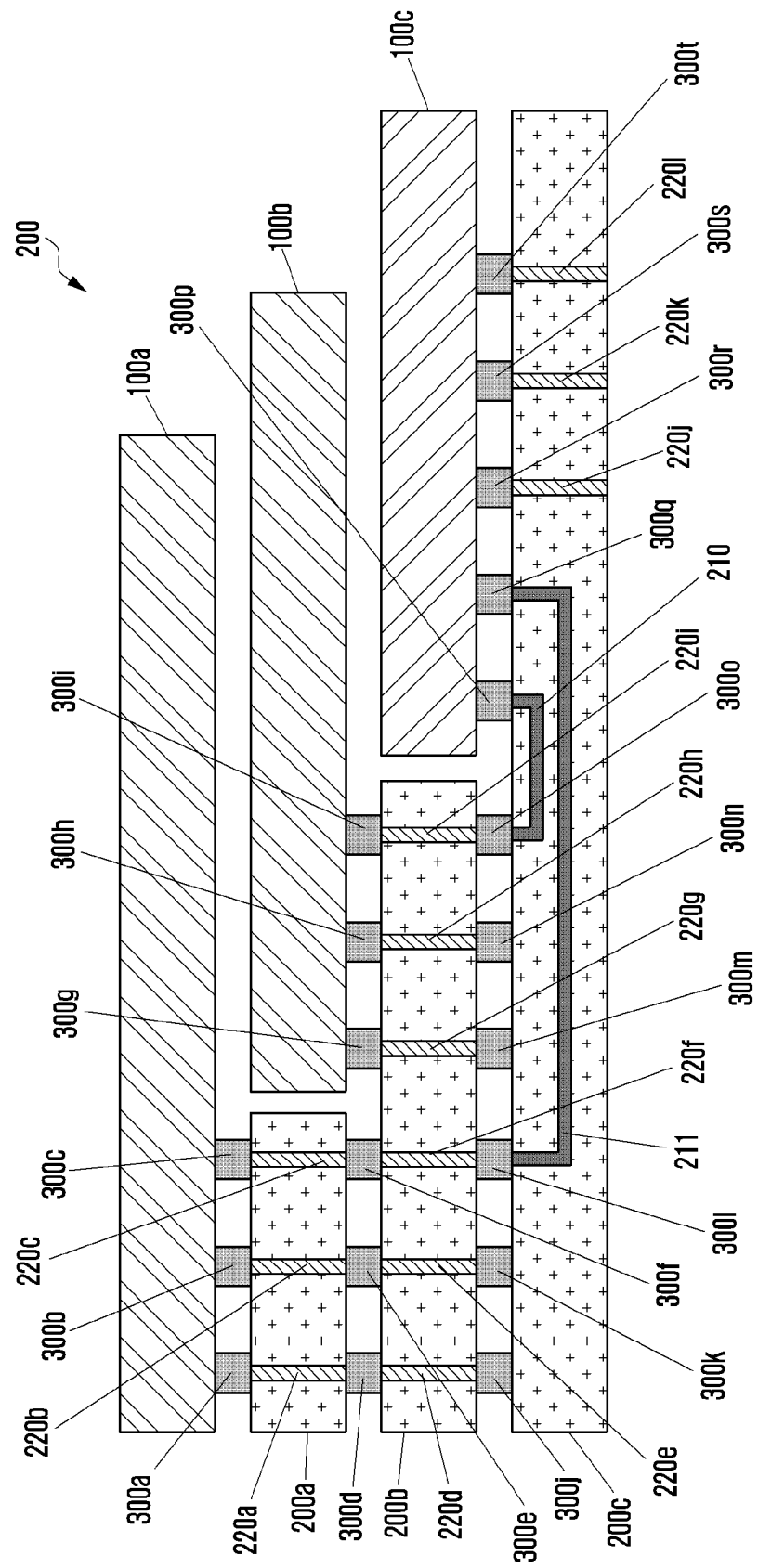
FIG. 2A and FIG. 2B are cross-sectional views illustrating a semiconductor device according to another example, with FIG. 2A being a partial cross sectional view showing the device without a substrate and FIG. 2B showing the device with a substrate.
Figure 2B:
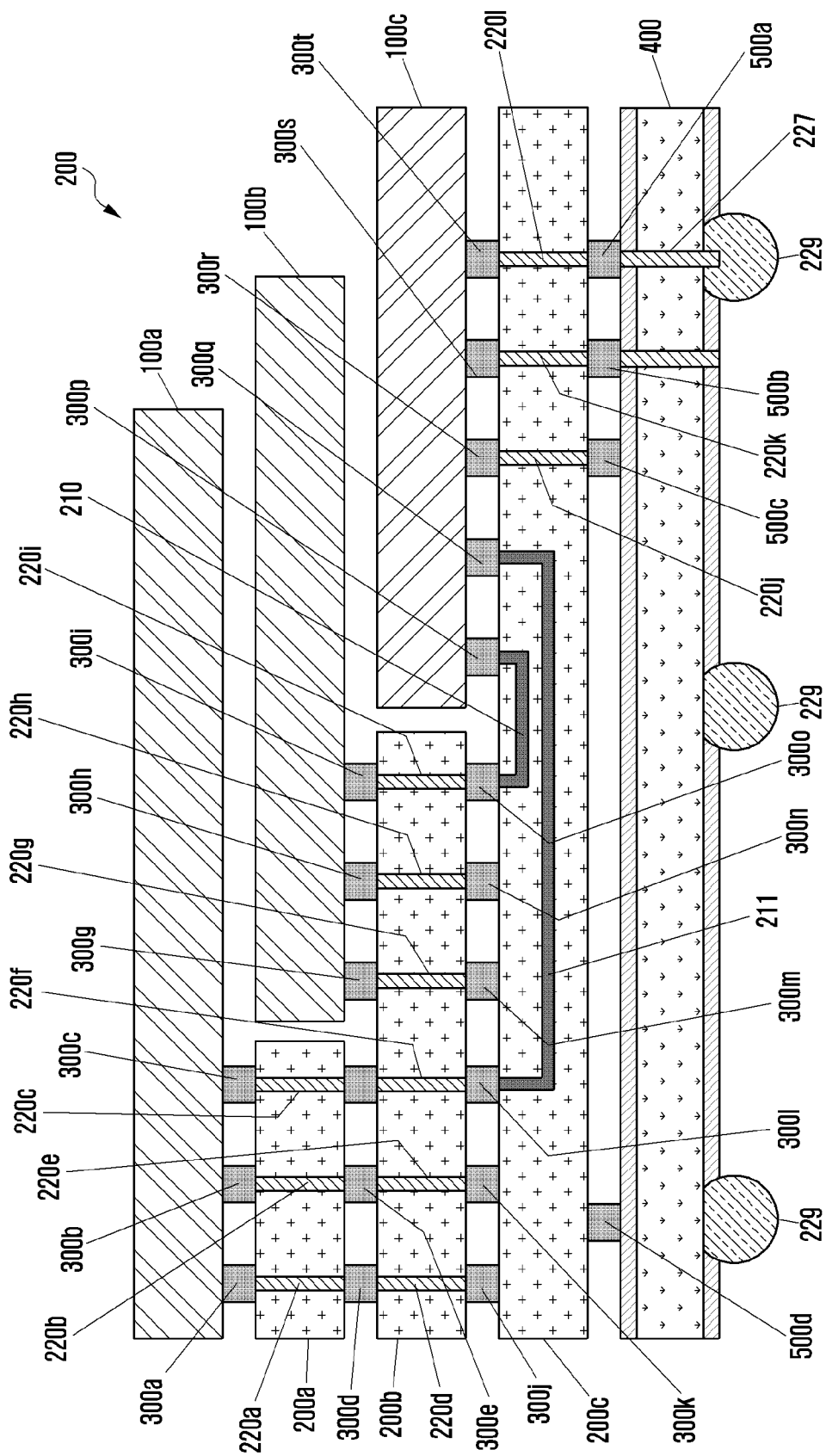

FIGS. 2A and 2B are cross-sectional views illustrating a semiconductor device, 200, according to another exemplary embodiment of the present invention. For clarity of illustration, FIG. 2A shows device 200 without a substrate whereas FIG. 2B shows device 200 with a substrate. One difference between semiconductor device 200 and device 100 described above is the addition of another vertical layer which may be used to stack an additional memory chip.

The semiconductor device 200 may include a plurality of semiconductor chips 100a, 100b, 100c, 200a, 200b, and 200c that exchange an electrical signal. The plurality of semiconductor chips 100a, 100b, 100c, 200a, 200b, and 200c may exchange an electrical signal over a partial region, and the lowest chip 200c may be connected on a substrate 400 using at least one flip chip pad 500a, 500b, 500c, and 500d.

According to an exemplary embodiment, the semiconductor device 200 may also include a controller (not shown) formed within one of the chips (e.g., within chip 100c). Some of the semiconductor chips 100a, 100b, 100c, 200a, 200b, and 200c may individually connect to the controller, which in turn may be connected to an external device. The controller may comprise an interface that connects the external device and the semiconductor device 200 and may control data flow and operation of each of the semiconductor chips 100a, 100b, 100c, 200a, 200b, and 200c within device 200.

The plurality of semiconductor chips 100a, 100b, 100c, 200a, 200b, and 200c may include at least one active chip 100a, 100b, and 100c and at least one dummy chip 200a, 200b, and 200c.

The at least one active chip 100a, 100b, and 100c may include at least one memory chip 100a and 100b that performs a memory function and at least one non-memory chip 100c. The at least one memory chip 100a and 100b may be a volatile memory (e.g., RAM) or a non-volatile memory (e.g., ROM, FLASH memory). The at least one non-memory chip 100c may be a processor or an AP, which may embody the above-noted controller.

A plurality of dummy chips 200a, 200b, and 200c may each be a semiconductor chip for exchanging an electrical signal between stacked active chips 100a, 100b, and 100c. At least one dummy chip 200a, 200b, and 200c may each include at least one TSV. The first dummy chip 200a may include at least one TSV 200a, 200b, and 200c. The second dummy chip 200b may include at least one TSV 220d, 220e, 220f, 220g, 220h, and 220i. The third dummy chip 200c may include at least one TSV 220j, 220k, and 220l. The third dummy chip 200c may further include at least one connection wiring 210 and 211 that can exchange an electrical signal between the second dummy chip 200b and the non-memory chip 100c. The active chips 100a, 100b, and 100c may be each separately connected to a power source.

The plurality of semiconductor chips 100a, 100b, 100c, 200a, 200b, and 200c may exchange an electrical signal with one another via at least one conductive bump 300a-300u formed at one surface thereof. The chips are arranged in a vertical stack, with a substrate 400 being at the lowest vertical level and chip 100a at the highest level of the stack. Dummy chip 200a and active chip 100b are at the next highest level and are laterally offset from one another in the horizontal plane. At the next level resides dummy chip 200b and active chip 100c laterally offset from one another, where dummy chip 200b is shown wider horizontally than dummy chip 200a so as to accommodate more TSVs, thereby providing TSV connections between chip 100c and both of chips 100a, 100b. Dummy chip 200c is disposed at the next vertical layer, adjacent to substrate 400.

In an exemplary embodiment, at least one memory chip 100a and 100b may transfer an electrical signal to the first dummy chip 200a and the second dummy chip 200b through at least one conductive bump 300a, 300b, 300c, 300g, 300h, and 300i disposed at one surface thereof. The first memory chip 100a may transfer an electrical signal to the first dummy chip 200a through at least one conductive bump 300a, 300b, and 300c disposed at one surface thereof. The second memory chip 100b may transfer an electrical signal to the second memory chip 100b through at least one conductive bump 300g, 300h, and 300i disposed at one surface thereof.

When an electrical signal is transferred to the at least one conductive bump 300a, 300b, and 300c disposed at one surface of the first memory chip 100a, the first dummy chip 200a may transfer an electrical signal to at least one TSV 220a, 220b, and 220c connected to the at least one conductive bump 300a, 300b, and 300c.

When an electrical signal is transferred to the at least one TSV 220a, 220b, and 220c connected to the at least one conductive bump 300a, 300b, and 300c, the first dummy chip 200a may transfer an electrical signal to at least one conductive bump 300a, 300b, and 300c disposed at one surface of the first memory chip 100a.

The first dummy chip 200a may transfer an electrical signal received from the memory chip 100a to the second dummy chip 200b through the at least one conductive bump 300a, 300b, and 300c disposed at one surface thereof. The first dummy chip 200a may transfer an electrical signal received from the second dummy chip 200b to the first dummy chip 200a through at least one conductive bump 300d, 300e, and 300f disposed at one surface thereof.

When an electrical signal is transferred to the at least one conductive bump 300g, 300h, and 300i disposed at one surface of the second memory chip 100b, the second dummy chip 200b may transfer an electrical signal to at least one TSV 220g, 220h, and 220i connected to the at least one conductive bump 300g, 300h, and 300i. When an electrical signal is transferred to the at least one TSV 220g, 220h, and 220i connected to the at least one conductive bump 300g, 300h, and 300i, the second dummy chip 200b may transfer an electrical signal to at least one conductive bump 300g, 300h, and 300i disposed at one surface of the second memory chip 100b.

The second dummy chip 200b may transfer a signal received from at least one first memory chip 100a and second memory chip 100b through the at least one connection wiring 210 and 211 connected to at least one conductive bump 300j, 300k, 300l, 300m, 300n, and 300o disposed at one surface thereof to the third dummy chip 200c and at least one non-memory chip 100c. The second dummy chip 200b may transfer a signal received from the non-memory chip 100c through the at least one connection wiring 210 and 211 connected to at least one conductive bump 300j, 300k, 300l, 300m, 300n, and 300o disposed at one surface thereof to the at least one first memory chip 100a and second memory chip 100b.

Substrate 400 includes a plurality of balls 229 of a ball grid array provided at a lower surface thereof. Balls 229 are used to make individual connections to points of an external device and desired connection points of device 200. For example, a TSV 227, similar to TSV 27 described above, is formed within substrate 400 and connects the right-most ball 229 to a desired connection point of chip 100c through the path including flip chip pad 500a, TSV 220I and bump 300t. In an exemplary embodiment, the third dummy chip 200c may transfer the received electrical signal at bump 229 to the controller (formed in chip 200c) through at least one TSV 220j, 220k, and 220l. The third dummy chip 200c may transfer electrical signals to and from the substrate 400 and chip 100c through at least one flip chip 500a, 500b, 500c, and 500d connected to at least one TSV 220j, 220k, and 220l. Direct pathways for connections to memory chips 100a and/or 100b are also possible from external devices that make connections to bumps 229, through other TSVs in substrate 400 and dummy chips 200c, 200b and 200a. The top surface 401 of substrate 400 is metalized and may be patterned to provide additional circuit pathways between flip chip pads 500l, 500b, etc. if desired.

In an exemplary embodiment, the at least one non-memory chip 100c may transfer an electrical signal to the third dummy chip 200c through at least one conductive bump 300p, 300q, 300r, 300s, and 300t disposed at one surface thereof. When an electrical signal is transferred to at least one conductive bump 300p, 300q, 300r, 300s, and 300t disposed at one surface of the at least one non-memory chip 100c, the third dummy chip 200c may transfer an electrical signal to at least one TSV 220j, 220k, and 220l and the at least one connection wiring 210 and 211 connected to the at least one conductive bump 300p, 300q, 300r, 300s, and 300t. The at least one connection wiring 210 and 211 may connect at least one conductive bump 300j, 300k, 300l, 300m, 300n, and 300o disposed at one surface of the second dummy chip 200b and at least one conductive bump 300p, 300q, 300r, 300s, and 300t disposed at one surface of the at least one non-memory chip 100c. The third dummy chip 200c may transfer an electrical signal received from the at least one non-memory chip 100c through the at least one connection wiring 210 and 211 to the second dummy chip 200b.

In an exemplary embodiment, the third dummy chip 200c may transfer the received electrical signal to the controller through at least one TSV 220j, 220k, and 220l. The third dummy chip 200c may transfer an electrical signal to the substrate 400 through at least one flip chip 500a, 500b, 500c, and 500d connected to the at least one TSV 220j, 220k, and 220l. The second dummy chip 200b may transfer a signal of the at least one non-memory chip 100c received from the third dummy chip 200c to at least one TSV 220d, 220e, 220f, 220g, 220h, and 220i connected to at least one conductive bump 300j, 300k, 300l, 300m, 300n, and 300o disposed at one surface thereof, and the second dummy chip 200b may transfer a signal of the at least one non-memory chip 100c received from the third dummy chip 200c through at least one conductive bump 300j, 300k, 300l, 300m, 300n, and 300o connected to at least one TSV 220d, 220e, 220f, 220g, 220h, and 220i to the at least one first dummy chip 200a and second memory chip 100b. The first dummy chip 200a may transfer a signal of the at least non-memory chip 100c received through at least one conductive bump 300d, 300e, and 300f connected to at least one TSV 220d, 220e, and 220f to the first memory chip 100a.

A semiconductor device according to an exemplary embodiment of the present invention, such as those exemplified by devices 100 and 200 described above, may include: at least one dummy chip including at least one TSV; and at least one active chip connected to the at least one dummy chip and that can exchange an electrical signal through the at least one dummy chip.

The at least one active chip according to an exemplary embodiment of the present invention may include at least one memory chip and at least one non-memory chip.

A semiconductor device according to an exemplary embodiment of the present invention may further include at least one conductive bump disposed at one surface of the at least one dummy chip and the at least one active chip to exchange an electrical signal.

The at least one dummy chip according to an exemplary embodiment of the present invention may include at least one connection wiring that can electrically connect a first conductive bump at a surface of the dummy chip with a second conductive bump at a surface of the active chip.

A semiconductor device according to an exemplary embodiment of the present invention may further include a substrate connected to the at least one dummy chip and the at least one active chip.

A semiconductor device according to an exemplary embodiment of the present invention may further include a controller connected to the at least one dummy chip and the at least one active chip. The controller may be part of the active chip.

The at least one memory chip according to an exemplary embodiment of the present invention may be one of a non-volatile memory chip and a volatile memory chip.

The at least one non-memory chip according to an exemplary embodiment of the present invention may be one of a processor and an application processor.

Active chips according to an exemplary embodiment of the present invention may be each connected to a separate power source.

A semiconductor device according to an exemplary embodiment of the present invention may be included in an electronic device. The semiconductor device included in the electronic device may perform a memory function and a processor function of the electronic device.

An electronic device according to an exemplary embodiment of the present invention may be a device having a communication function. Examples of the electronic device include a smart phone, tablet Personal Computer (PC), mobile phone, video phone, e-book reader, desktop PC, laptop PC, Netbook computer, Personal Digital Assistant (PDA), Portable Multimedia Player (PMP), Moving Picture Experts Group layer-3 (MP3) player, mobile medical equipment, camera, or wearable device (e.g., Head-Mounted-Device (HMD) such as electronic glasses), electronic clothing, electronic bracelet, electronic necklace, electronic accessory, electronic tattoo, or smart watch.

According to various exemplary embodiments, the electronic device may be a smart home appliance having a communication function. The smart home appliance, for example, may be a television, Digital Video Disk (DVD) player, audio device, refrigerator, air conditioner, vacuum cleaner, oven, microwave oven, washing machine, air cleaner, set-top box, television box (e.g., Samsung HomeSync™), game consoles, electronic dictionary, electronic key, camcorder, or electronic frame.

According to various exemplary embodiments, the electronic device may include at least one of various medical equipments (e.g., Magnetic Resonance Angiography (MRA) device, Magnetic Resonance Imaging (MRI) device, Computed Tomography (CT) device, scanning device, and ultrasonic wave device), navigation device, Global Positioning System (GPS) receiver, Event Data Recorder (EDR), Flight Data Recorder (FDR), vehicle infotainment device, electronic equipment for ship (e.g., navigation device for ship and gyro compass), avionics, security device, or industrial or home robot.

According to various exemplary embodiments, the electronic device may include at least one of a portion of furniture or building/construction, electronic board, electronic signature receiving device, projector, or various measuring devices (e.g., water supply, electricity, gas, or electric wave measuring device) having a communication function. An electronic device according to the present invention may be at least one combination of the foregoing various devices. Further, an electronic device according to the present invention is not limited to the foregoing devices.

As described above, in an electronic device including a semiconductor device according to the present invention, by using a dummy chip including a TSV, a process cost can be reduced, and because each semiconductor chip connection location can be freely set, various designs are available.

Although exemplary embodiments of the present invention have been described in detail hereinabove, it should be clearly understood that many variations and modifications of the basic inventive concepts herein described, which may appear to those skilled in the art, will still fall within the spirit and scope of the exemplary embodiments of the present invention as defined in the appended claims.

What is claimed is:
1. An electronic device comprising a semiconductor device, the semiconductor device comprising:
   at least one dummy chip comprising at least one Through Silicon Via (TSV); and
   at least one active chip connected to the at least one dummy chip, wherein the at least one active chip transfers an electrical signal to another active chip through the at least one TSV of the at least one dummy chip, wherein the at least one active chip does not include the at least one TSV, wherein:

the at least one active chip and the at least one dummy chip are arranged in vertical stack;

the at least one active chip comprises a first memory chip at an upper-most layer of the stack, a second memory chip at a first lower layer of the stack, and a non-memory chip at a second lower layer of the stack;

the at least one dummy chip comprises a first dummy chip at the first lower layer of the stack laterally offset from the second memory chip, a second dummy chip at the second lower layer of the stack and laterally offset from the non-memory chip, and a third dummy chip at a vertical layer below the second lower layer; and each of the dummy chips comprises at least one TSV, the non-memory chip being electrically connected to the first memory chip in a first connection path comprising at least one TSV of the first dummy chip and at least one first TSV of the second dummy chip, and being electrically connected to the second memory chip through a second connection path comprising the at least one second TSV of the second dummy chip.

2. The electronic device of claim 1, wherein the at least one active chip comprises at least one memory chip and at least one non-memory chip.

3. The electronic device of claim 2, further comprising at least one conductive bump disposed at one surface of the at least one dummy chip and the at least one active chip to transfer an electrical signal.

4. The electronic device of claim 3, wherein the at least one dummy chip comprises at least one connection wiring that can electrically connect the at least one conductive bump.

5. The electronic device of claim 4, further comprising a substrate connected to the at least one dummy chip and the at least one active chip.

6. The electronic device of claim 5, further comprising a controller connected to the at least one dummy chip and the at least one active chip.

7. The electronic device of claim 6, wherein the at least one memory chip is one of a non-volatile memory chip and a volatile memory chip.

8. The electronic device of claim 7, wherein the at least one non-memory chip is one of a processor and an Application Processor (AP).

9. The electronic device of claim 8, wherein the at least one active chip comprises a plurality of active chips, each connected to a separate power source.

10. The electronic device of claim 1, wherein:

the at least one active chip comprises a first active chip at an upper-most layer of the stack and a second active chip at a second layer of the stack;

the at least one dummy chip comprises a first dummy chip at the second layer of the stack, laterally offset from the second active chip, and a second dummy chip at a vertical layer of the stack beneath the second layer.

11. The electronic device of claim 10, wherein the first dummy chip comprises a TSV, the second dummy chip comprises a connection wiring, and the second active chip is electrically connected to the first active chip through a connection path comprising the connection wiring and the TSV.

12. The electronic device of claim 11, wherein the connection path further comprises a first connection bump connected to one end of the connection wiring and disposed between a top surface of the second dummy chip and a bottom surface of the second active chip, a second connection bump connected to an opposite end of the connection wiring and disposed between the top surface of the second dummy chip and a bottom surface of the first dummy chip, and a third connection bump disposed between a top surface of the first dummy chip and a bottom surface of the first active chip.

13. The electronic device of claim 10, further comprising a substrate at a lowest layer of the stack, wherein:

the first dummy chip comprises a first TSV, the second dummy chip comprises a connection wiring, and the second active chip is electrically connected to the first active chip through a connection path comprising the connection wiring and the first TSV, a first connection point connected to one end of the connection wiring and disposed between a top surface of the second dummy chip and a bottom surface of the second active chip, a second connection point connected to an opposite end of the connection wiring and disposed between the top surface of the second dummy chip and a bottom surface of the first dummy chip, and a third connection point disposed between a top surface of the first dummy chip and a bottom surface of the first active chip;

wherein the second dummy chip comprises a second TSV that connects the substrate to the second active chip.

14. The electronic device of claim 13, wherein the substrate comprises a further TSV that connects a connection point of the TSV to an external device connection point of the substrate.

15. The electronic device of claim 14, wherein the first active chip is a memory chip and the second active chip is a non-memory chip.

16. The electronic device of claim 1, wherein the third dummy chip comprises a first connection wiring in the first connection path and a second connection wiring in the second connection path.

17. The electronic device of claim 16, further comprising a substrate having at least one TSV connecting a TSV of the third dummy chip with an external device connection point.

18. A semiconductor device comprising:

at least one dummy chip comprising at least one Through Silicon Via (TSV); and at least one active chip connected to the at least one dummy chip, wherein the at least one active chip transfers an electrical signal to another active chip through the at least one TSV of the at least one dummy chip, wherein the at least one active chip does not include the at least one TSV, wherein:

the at least one active chip and the at least one dummy chip are arranged in vertical stack;

the at least one active chip comprises a first memory chip at an upper-most layer of the stack, a second memory chip at a first lower layer of the stack, and a non-memory chip at a second lower layer of the stack;

the at least one dummy chip comprises a first dummy chip at the first lower layer of the stack laterally offset from the second memory chip, a second dummy chip at the second lower layer of the stack and laterally offset from the non-memory chip, and a third dummy chip at a vertical layer below the second lower layer; and each of the dummy chips comprises at least one TSV, the non-memory chip being electrically connected to the first memory chip in a first connection path comprising at least one TSV of the first dummy chip and at least one first TSV of the second dummy chip, and being electrically connected to the second memory chip through a second connection path comprising the at least one second TSV of the second dummy chip.

19. The electronic device of claim 1, wherein the at least one dummy chip serves a connection function and is devoid of active circuitry for other functions.

20. The semiconductor device of claim 18, wherein the at least one dummy chip serves a connection function and is devoid of active circuitry for other functions.

* * * * *